United States Patent [19]

Hirao

[11] Patent Number: 4,728,618
[45] Date of Patent: Mar. 1, 1988

[54] METHOD OF MAKING A SELF-ALIGNED BIPOLAR USING DIFFERENTIAL OXIDATION AND DIFFUSION

[75] Inventor: Tadashi Hirao, Hyogo, Japan

[73] Assignee: Mitsubishi Denki Kabushiki Kaisha, Tokyo, Japan

[21] Appl. No.: 833,327

[22] Filed: Feb. 25, 1986

[30] Foreign Application Priority Data

Apr. 10, 1985 [JP] Japan ................. 60-77682
Jun. 28, 1985 [JP] Japan ................. 60-143206

[51] Int. Cl.$^4$ ............... H01L 21/265; H01L 21/302; H01L 21/283; H01L 21/20
[52] U.S. Cl. ......................... 437/33; 437/46; 437/69; 437/151; 437/162; 437/985; 357/34; 357/50; 357/59
[58] Field of Search .............. 29/576 W, 578, 576 B, 29/576 C; 148/1.5, 189, 33.4, DIG. 11, 3, 44, 51, 117, 124; 357/34, 43, 50, 59

[56] References Cited

U.S. PATENT DOCUMENTS

| | | | |
|---|---|---|---|
| 4,433,470 | 2/1984 | Kameyama et al. | 29/577 C |
| 4,467,519 | 8/1984 | Glang et al. | 29/576 B |
| 4,481,706 | 11/1984 | Roche | 29/577 C |
| 4,486,942 | 12/1984 | Hirao | 29/571 |
| 4,498,227 | 2/1985 | Howell et al. | 29/576 B |
| 4,499,657 | 2/1985 | Ooga et al. | 29/578 |
| 4,561,169 | 12/1985 | Miyazaki et al. | 29/571 |

OTHER PUBLICATIONS

C. G. Jambotkar, "Emitter Butting Against Recessed Oxide Isolation . . . ", TDB, vol. 27, No. 3, Aug. 1984, p. 1809.

*Primary Examiner*—Brian E. Hearn
*Assistant Examiner*—William Bunch
*Attorney, Agent, or Firm*—Wolf, Greenfield & Sacks

[57] ABSTRACT

A method for manufacturing semiconductor device with improved frequency characteristics is provided. The base resistance and the base-to-collector capacitance are reduced by minimizing a base area and a space between an emitter and the base. The minimization of the base area is brought about by forming the emitter region in the base region by self-aligned process. The minimization of the space between the emitter and the base is accomplished by presenting only an insulator layer between a silicon layer on the emitter region and a metal wiring on the base region.

20 Claims, 23 Drawing Figures

METHOD OF MAKING A SELF-ALIGNED BIPOLAR USING DIFFERENTIAL OXIDATION AND DIFFUSION

BACKGROUND OF THE INVENTION

1. Field of the Invention

This invention relates generally to semiconductor manufacturing methods and more particularly to improved methods for forming an electrode contact portion of a base in bipolar semiconductor integrated circuits.

2. Description of the Prior Art

Generally, transistors in bipolar semiconductor integrated circuits are formed in respective islands that are electrically isolated from one another by utilizing, for example, p-n junction isolation, oxide isolation using selective oxidizing technique, or triple diffusion. In the ensuing description, explanation will only be given of a method for forming npn transistors by using oxide isolation. However, it should be understood that various isolation methods may be used instead of the specified example.

Referring to FIGS. 1A-1E, there are shown cross-sectional views of a semiconductor device structure in the prior art at primary steps in the manufacture thereof.

Figure 1A:
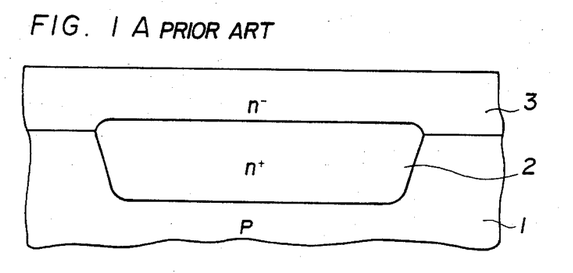
FIGS. 1A through 1E are cross-sectional views of a semiconductor device at the various steps in a manufacturing method of the prior art.

First of all, in FIG. 1A, a high impurity concentration layer 2 of n-type (or n+-type) conductivity is selectively formed in a p-type (or p−-type) conductivity silicon substrate 1 having low impurity concentration; the layer 2 will be a collector buried layer. Next, an epitaxial layer 3 of n−-type conductivity is grown over the silicon substrate 1 and the layer 2.

Figure 1B:
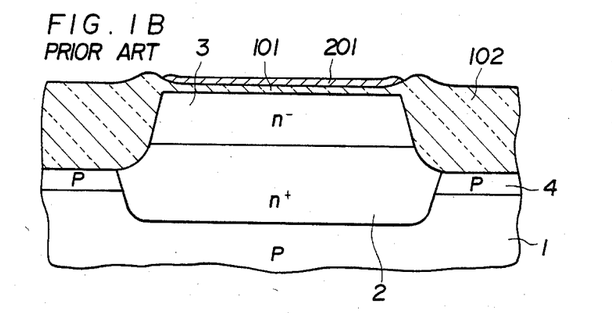

Referring to FIG. 1B, an pad oxide layer (film) 101 and a nitride layer (film) 201 are formed over a predetermined region on the layer 3. A p-type layer 4 for the use of channel cutting (stopping) is formed by using nitride layer 201 as a mask and then a thick isolation oxide layer 102 is formed by a selective oxidizing technique using the nitride layer 201 as a mask at the same time as annealing the layer 4.

Figure 1C:
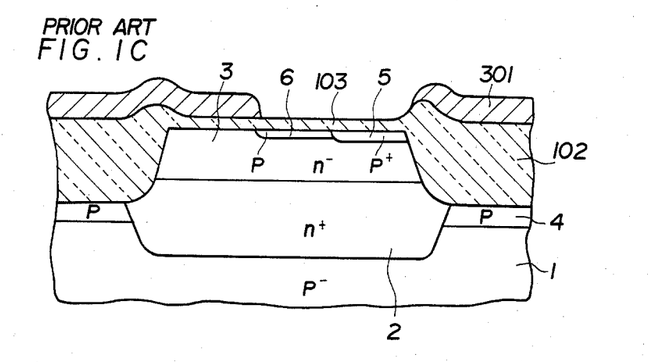

Referring to FIG. 1C, the pad oxide layer 101 is removed, as well as the nitride layer 201 used as the mask for the selective oxidizing. Next, an oxide layer 103 to be used as a protective layer during ion implantation is newly formed and a p+-type layer 5 which will be an external base layer is formed using a photoresist layer (not shown) as a mask. Then the photoresist layer is removed and another photoresist layer 301 is formed in a predetermined pattern, which layer 301 is used as a mask when a p-type layer 6 is formed by ion implantation, layer 6 forming an active base layer.

Figure 1D:
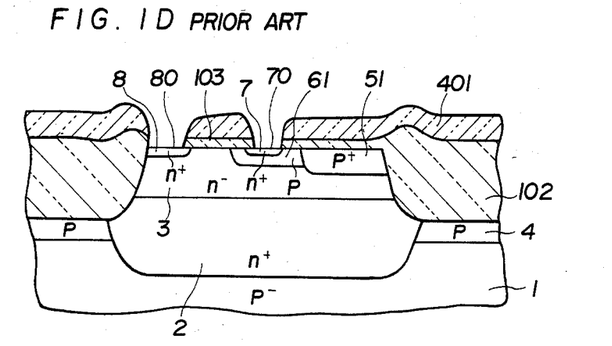

Referring now to FIG. 1D, the photoresist layer 301 is removed and a passivation layer 401 of phospho silicate glass (PSG) is deposited, as shown. After a heat treatment for the purpose of annealing the layers 5 and 6 and sintering the PSG layer 401, an external base layer 51 and an active base layer 61 being in intermediate stages are formed, as shown. Then, windows (holes) 70 and 80 for contact with an emitter region and a collector region, respectively, are formed in the predetermined regions of the PSG layer 401 so that an n+-type layer 7 which will act as an emitter layer and an n+-type layer 8 which will act as a collector electrode contact portion are formed by ion implantation through the respective contact holes, as shown.

Figure 1E:
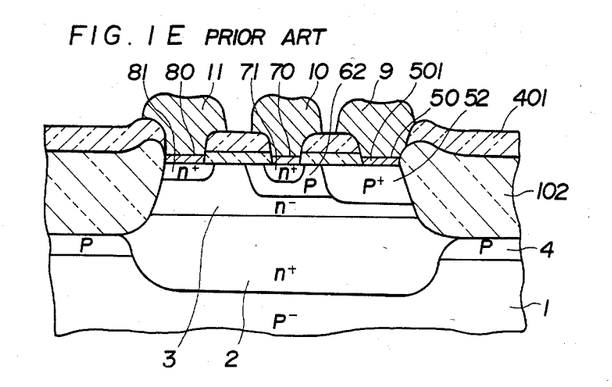

Last of all, referring to FIG. 1E, respective ion implanted layers are annealed and an external base layer 52 and an active base layer 62 are established, while an emitter layer 71 and a collector electrode contact layer 81 are formed, as illustrated. In the windows (contact holes), a metal silicide layer 501 is formed to prevent any penetration through the electrodes (for example, to prevent the reaction between Al and Si). Platinum silicide (Pt-Si) or palladium silicide (Pd-Si) may be used as the metal silicide 501. On such metal silicide layer 501, a base electrode wiring 9, an emitter electrode wiring 10 and a collector electrode wiring 11 are formed by using low resistance metal such as aluminum (Al).

Problem in the Prior Art

As is known in the art, the frequency characteristics of transistors depend on the base-to-collector capacitance and the base resistance. Accordingly, in order to improve the frequency characteristics of transistors, the base-to-collector capacitance and the base resistance are necessarily made small. In the aforementioned structure of the prior art, it is the external base layer 52 of p+-type which is provided to decrease the base resistance.

On the other hand, the external base layer 52 causes the base-to-collector capacitance to increase.

Figure 2:
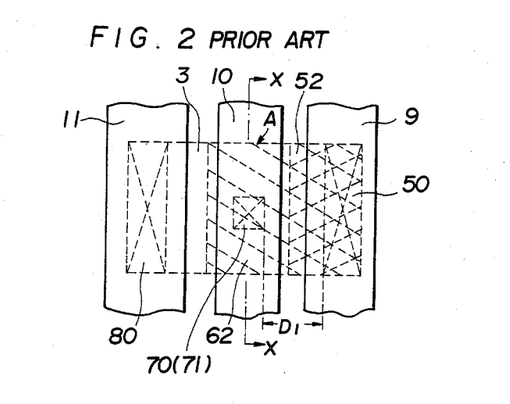
FIG. 2 is a plan view of the pattern of a transistor fabricated in accordance with a method of the prior art.

Referring now to FIG. 2, there is shown a plan view of the pattern of a transistor produced in accordance with a prior manufacturing method. In FIG. 2, the base resistance depends on the distance (space) $D_1$ from the emitter layer 71 to the contact hole 50 for the base electrode, as shown. Such distance is the sum of the distance between the base electrode wiring 9 and the emitter electrode wiring 10 and the distances of the electrode wirings 9 and 10 protruded over the respective holes 50 and 70. As a result, even if the distance between the electrode wirings is made small by improving the accuracy of photoetching (photolithography), the protruded distance cannot be changed. In addition, the base region between the emitter layer 71 and the boundary A of the oxide isolation layer shown in FIG. 2 is an inactive region and, therefore, causes the base-to-collector capacitance to increase. A walled emitter structure may be used to get rid of such nonactive region, in which structure the emitter layer 71 is in contact with the oxide isolation layer. However, the walled emitter structure has some problems which will be described.

Figure 3A:
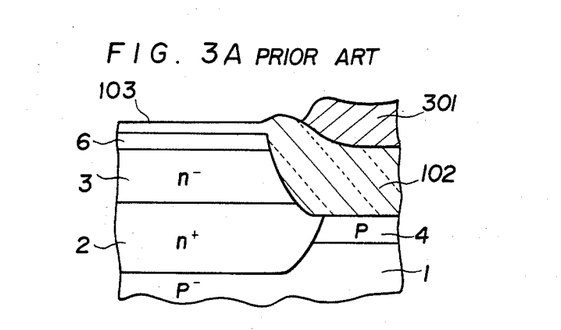
FIGS. 3A through 3C are cross-sectional views illustrating portions adjacent to an oxide isolation layer in case of forming an emitter layer in contact with the isolation layer in accordance with the prior art.
Figure 3B:
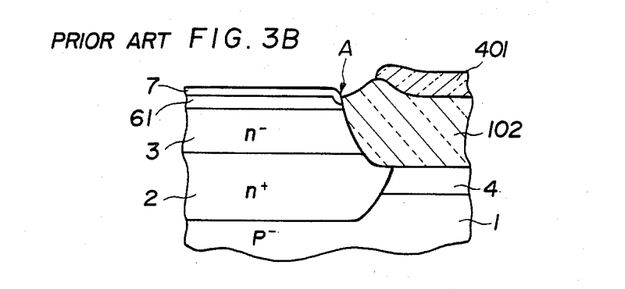
Figure 3C:
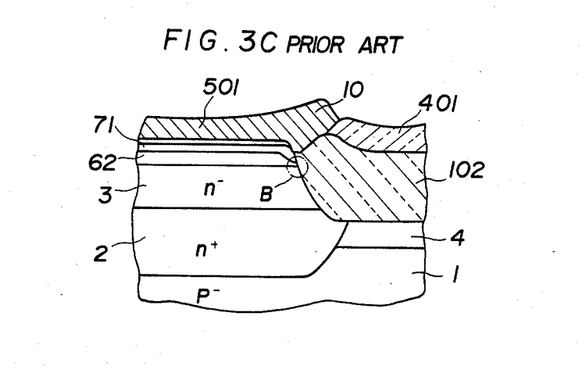

Referring now to FIGS. 3A-3C, there are shown partial cross sectional views of FIG. 2 taken along line X—X. The problems associated with the walled emitter structure in the prior art will be described in connection with FIGS. 3A-3C.

Referring to FIG. 3A, there is shown a state in which a p-type impurity, here boron, is implanted using the photoresist layer 301 as a mask to form a base region. Then, it is necessary to remove the oxide layer 103 on the emitter region 7 to form a contact hole. In the wall emitter structure, however, the boundary A of the oxide isolation layer 102 is excessively etched away such as is shown in FIG. 3B when the oxide layer is removed. It follows from this that the emitter region is deepened as shown by B in FIG. 3C. As a result, the current amplification factor then gets out of control and a short circuit may arise between the collector and the emitter in the region B.

Figure 4:
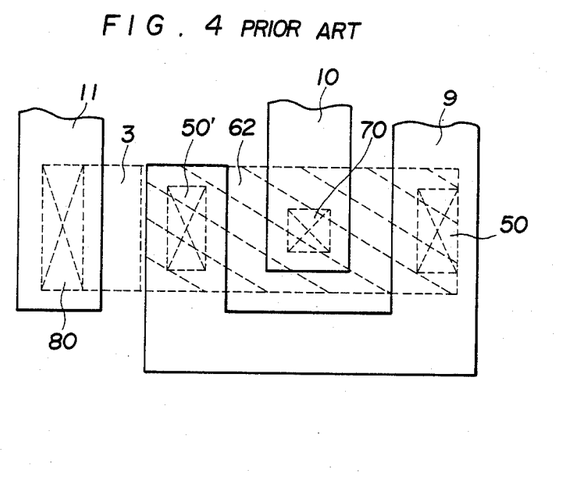
FIG. 4 is a plan view of the pattern of a double base type transistor fabricated in accordance with a prior art method.

In order to lower the base resistance, a double base structure is often employed such as is shown in FIG. 4. In the prior art, however, the base-to-collector capacitance is somewhat increased because the base region is expanded due to the necessity to take out the base electrode.

Further, since the emitter-base junction is deeper than the surface of the external base region in the prior art, the current amplitude factor depends more on the current. To put it another way, since the current is absorbed due to, for example, recombination in interfaces (for example, interface between emitter and base regions), the current amplitude factor in a lower current region cannot be effectively controlled.

SUMMARY OF THE INVENTION

Accordingly, it is an object of this invention to resolve the aforementioned problems associated with the prior art, to decrease the base resistance and the base-to-collector capacitance, to reduce the dependence of the current amplitude factor on the current in the low current region, and to provide semiconductor manufacturing methods by which semiconductor devices with improved frequency characteristics may be obtained.

In accordance with the present invention, the manufacturing method comprises the steps of forming a silicon layer (either of single-crystalline, poly-crystalline, or amorphous) having an impurity diffusion source for the use of forming an emitter region on a semiconductor substrate region which will be an emitter region, forming a base region, a portion of the base region being formed by ion implantation through the silicon layer, and forming the emitter region by self-aligned process in the base region using the silicon layer. In addition, the method comprises the steps of forming an insulator layer between the silicon layer and a region for taking out a base electrode (a base electrode contact region) on the emitter region in self-aligned fashion to insulate the base and the emitter electrodes from each other, and forming the base electrode contact region in self-aligned fashion. In these steps, the emitter-base junction is made shallower than the surface of an external base region and as deep as the base electrode contact region.

With such steps, since the emitter region is formed in the base region in self-aligned fashion, such emitter region becomes an emitter region diffusion source and a base electrode contact region of minimum area can be formed in self-aligned fashion around the emitter layer of silicon by using a patterning mask of a polysilicon layer connected to a metal electrode.

Further, since only the insulator layer is disposed between the silicon layer on the emitter region and a metal wiring on the base region, the distance between the emitter and the base is as small as the thickness of the insulator layer.

Furthermore, since the emitter region is formed by diffusing an impurity from the poly-silicon layer as an impurity diffusion source into a region which will act as the emitter region, it is not necessary for a contact hole to be formed for ion implantation when the emitter region is formed. As a result, since it is not necessary for the oxide layer on the emitter region to be removed and excessive etching at the boundary of the oxide isolation layer is prevented, the emitter and the base regions contact the isolation region in approximately parallel relationship.

Furthermore in accordance with the present invention, since the emitter-base junction is shallower than the surface of the external base region, the current is kept free from absorption due to recombination and the dependence of the current amplification factor upon the current is lowered.

BRIEF DESCRIPTION OF THE DRAWINGS

The foregoing feactures and other aspects of the invention are explained in the following detailed description taken in connection with the accompanying drawings wherein.

DETAILED DESCRIPTION OF PREFERRED EMBODIMENTS

Referring to FIGS. 5A–5J, an embodiment of the invention is shown.

Figure 5A:
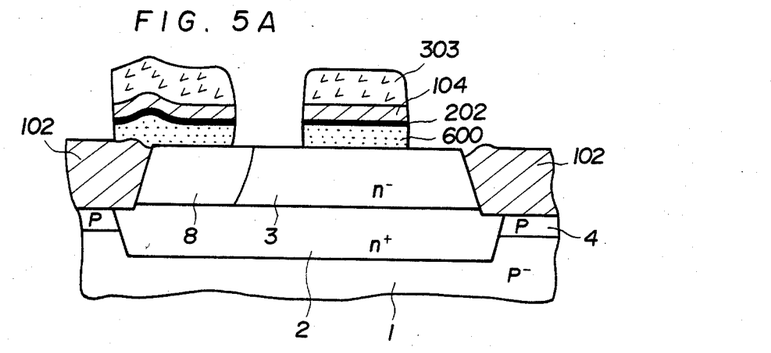
FIGS. 5A through 5J are cross-sectional views of a semiconductor device at the various steps in a manufacturing method of an embodiment in accordance with the invention.

Referring first to FIG. 5A, an $n^+$-type collector buried layer 2, an $n^-$-type epitaxial layer 3, a p-type channel cutting (or stopping) layer 4, an isolation oxide layer 102, and an $n^+$-type diffusion layer 8 which will act as a collector electrode contact region (that is, a region for taking out a collector electrode) are formed on predetermined regions of a $p^-$-type silicon substrate 1. Each layer is formed in a conventional manner, as shown in FIGS. 1A and 1B. Next, after removal of an underlying oxide layer 101 and a nitride layer 201 such as is shown in FIG. 1B, a silicon layer (preferably a polysilicon layer) 600, a nitride layer 102 and an oxide layer 104 are successively formed sequentially on the surface of the semiconductor substrate 1. Then, selective portions of the multiple layer film constructed of the polysilicon layer 600, the nitride layer 202, and the oxide layer 104 are etched away, using a photoresist layer 303 having a predetermined pattern as an etching mask. With this patterning, the oxide layer 104, the nitride layer 202 and the polysilicon layer 600 are left only in the regions which later become a collector electrode contact layer and an emitter electrode contact layer, as shown.

Figure 5B:
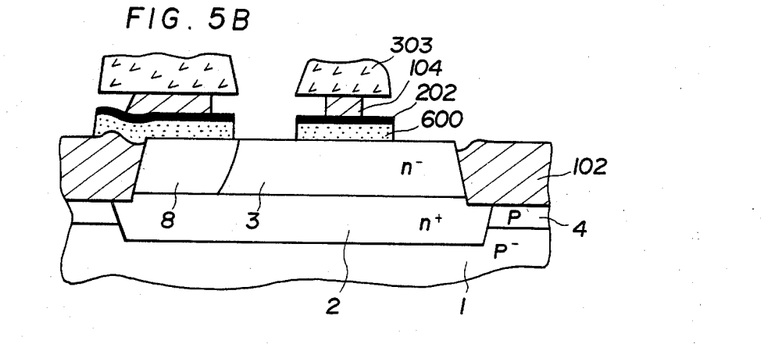

Referring now to FIG. 5B, only the sidewalls of the oxide layer 104 included in the multiple layer are etched away, using the aforementioned photoresist layer 303 as a mask. As a result, the oxide layer 104 is recessed to a greater extent than the polysilicon layer 600 and the nitride layer 202.

Figure 5C:
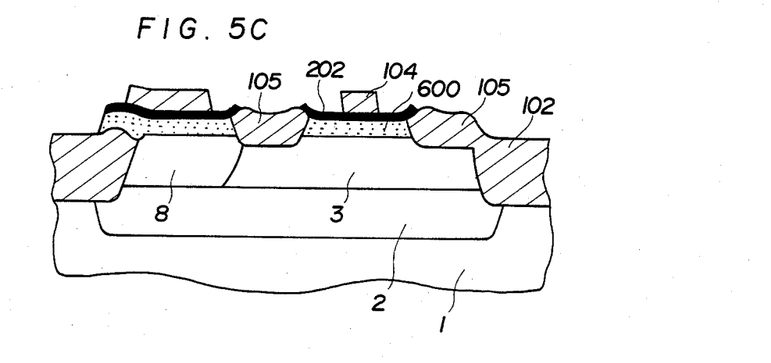

Referring now to FIG. 5C, an oxide layer 105 is formed on predetermined regions of the semiconductor surface by selective oxidizing using the nitride layer 202 as a mask.

Figure 5D:
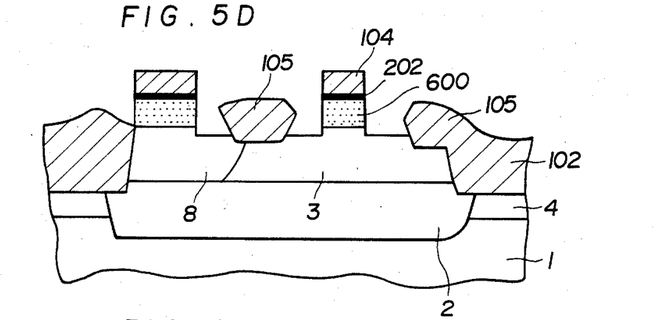

In FIG. 5D, selective portions of the nitride layer 202 and the polysilicon layer 600 underlying the layer 202 are etched away, using the oxide layer 104 as a mask. Upon the patterning of the layers 202 and 600, a predetermined thickness of the silicon substrate 3 (of n−-type) is etched away so that this portion is thinned such as to become a base electrode. This is done for the purpose of forming an emitter junction (a junction of an active base region and an emitter region) at the same depth as the base electrode contact layer so as to decrease the dependence of the current amplification factor upon the current. That is, by avoiding the absorption of current due to recombination, the current amplification factor can be fully controlled even in lower current regions.

Figure 5E:
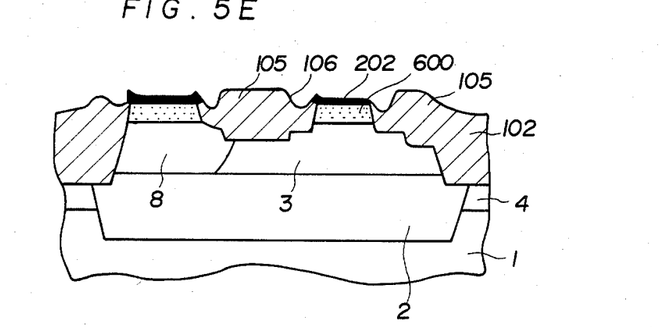

Referring now to FIG. 5E, after removal of the oxide layer 104, an oxide layer 106 is formed on the semiconductor substrate between the polysilicon layer 600 and the oxide layer 105 by selective oxidation using the nitride layer 202 as a mask. In this case, the selective oxidation is not carried out only to the thinned polysilicon layer 600, such oxidation is carried out also to the n−-type semiconductor region 3, whereby the layer 3 is oxidized a little. The oxide layer 106 covers the sidewalls of the polysilicon 600, as shown.

Figure 5F:
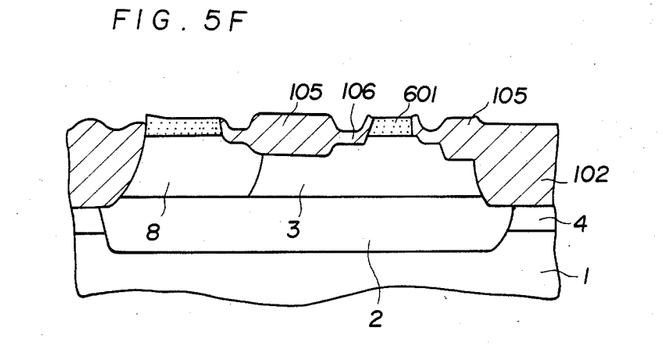

Referring now to FIG. 5F, first, the nitride layer 202 is removed. Next, an n+-type impurity is introduced into the polysilicon layer 600, using the oxide layer 106 as a mask, to form a doped polysilicon layer 601. With such process, the polysilicon layer 601 becomes an impurity diffusion source for the purpose of forming an emitter region.

Figure 5G:
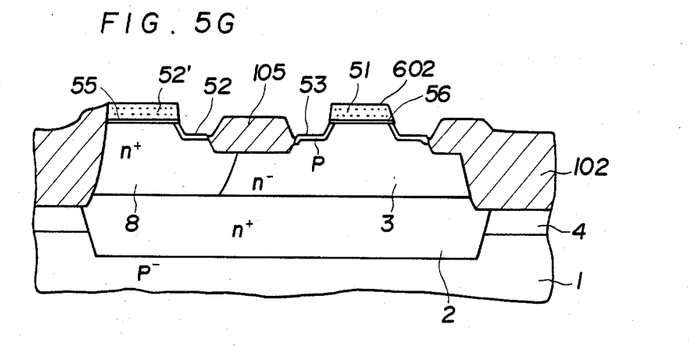

In FIG. 5G, after removal of the oxide layer 106, a p+-type impurity is ion implanted to form ion-implanted layers 52, 53, 55, and 56, as shown. The physical location of ion-implanted layers 55 and 56 will depend on the composition of silicon layers 52' and 600. In the illustrative embodiment, layers 52' and 600 are disclosed as polysilicon. In this case, ion-implanted layers will be physically located near the bottom of layers 52' and 600 or in the surface of the substrate directly under layers 52' and 600 as shown in FIG. 5G. Alternatively, if layers 52' and 600 are comprised of monocrystalline silicon which has a a higher crystallinity and lower diffusivity than polysilicon, then layers 55 and 56 will be located more towards the surface of layers 52' and 600. At this time, a region of the n−-type semiconductor region from which the oxide layer 106 has been removed becomes an external base layer. On the other hand, the oxide layer 105 is left in order that the base region and the collector region are isolated from each other. For that purpose, the oxide layer 105 is thickened to 1 μm during the selective oxidation in FIG. 5C and the oxide layer 106 is formed to have the thickness of 200–300 nm during the selective oxidation in FIG. 5E. The p-type layers 52 and 55, which are formed by ion implanting into the collector electrode contact region, have a negligible amount of impurities in comparison with the n+ diffusion layer 8 from which the collector electrode is taken out. Accordingly, the layers 52 and 55, when diffused into substrate layer 8, hardly have any effect upon the diffusion layer 8. Since the ion-implanted region 56 underlying the polysilicon layer 602 (that is, the polysilicon layer 600 in which a n+-type impurity is implanted), which region will act as an active base layer, is ion implanted by a p-type imputity through the polysilicon layer 601, such region is shallower than a region 53 which becomes an external base layer.

Figure 5H:
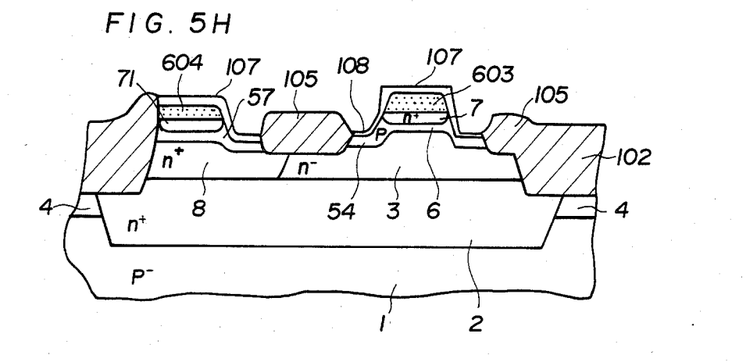

In FIG. 5H, annealing of the layer in which a p-type impurity is implanted is done at the same time as diffusion of an n+-type impurity from the polysilicon layer 602 to the silicon substrate 3. As a result, an emitter region 7 is formed by self-aligned process and an external base region 54 is formed so that the region 54 is a little deeper than an active base region 6 and the resistance of the region 54 is lower than that of the region 6. A similar diffusion process also occurs in the collector contact area. In particular, n+-type impurities diffuse from polysilicon layer 52' into substrate 8 to form a region, 71. In addition, the ion-implanted p-type impurities in layer 55 diffuse into substrate 8 to form a region 57. However, as previously mentioned, the concentration of the impurities in layers 71 and 57 is negligible with respect to the concentration of the impurities in the underlying substrate layer 8. Thus, although layers 71 and 57 are shown for clarity, the substrate layer 8 substantially retains its n+ characteristics. Accordingly, the effect of layers 71 and 57 is negligible and will be ignored in the following discussion. Next, by oxidization at low temperature (800° C.–900° C.), a thick oxide layer 107 and a thin oxide layer 108 are formed on n+-type polysilicon layers 603, 604 and on a p+-type silicon substrate 54, respectively. This is done by making use of the well-known fact that the lower the temperature is, the sooner the oxidization occurs when silicon or polysilicon includes a high density of n-type impurity, phosphorus or arsenic.

Figure 5I:
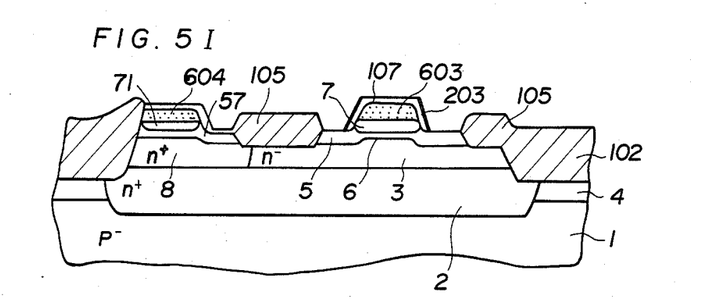

In FIG. 5I, the thin oxide layer 108 on the external base region 54 is removed by an anisotropic etching (RIE) being done on the oxide layers 107 and 108 formed on the polysilicon layers 603 and 604. Here, as a means for preventing a short circuit to the emitter layer 7 of the base electrode, there is a method comprising the steps of depositing a nitride layer 203 over the entire surface shown in FIG. 5H, leaving the nitride layer 203 only on the sidewalls of the polysilicon 603 by anisotropic etching, removing the oxide layer 108 by RIE (Reactive Ionbeam Etching), and keeping the oxide layer-nitride layer on the sidewalls of the polysilicon 603, as shown in FIG. 5I.

Figure 5J:
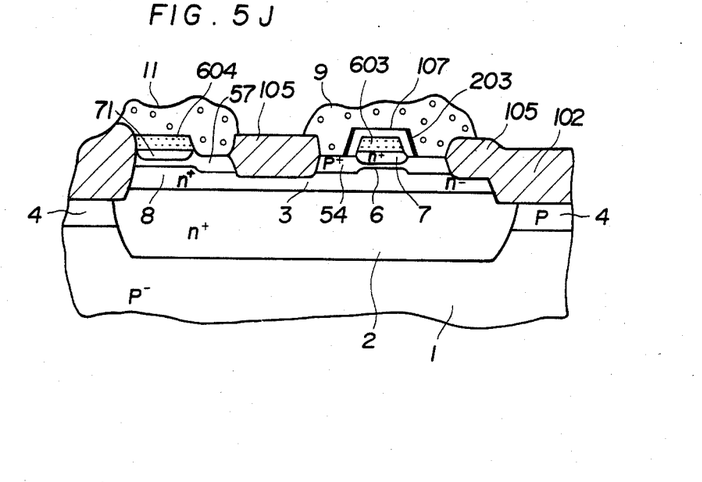

In FIG. 5J, first, the thick oxide layer 107 on the collector electrode contact region 8 is removed. Next, an emitter electrode contact hole 70 (not shown) and a collector electrode contact hole 80 (not shown) are formed is predetermined regions by selective etching. Then, a base electrode wiring 9, an emitter electrode wiring 10 (not shown) and a collector electrode wiring 11 are formed by using a low resistance metal such as aluminum (Al). As seen in FIG. 5J, the distance between the emitter and the base is approximately equal to the sum of the thickness of the oxide layer 107 on the sidewall of the polysilicon 603 and the thickness of the nitride layer 203, such distance being very small.

Figure 6:
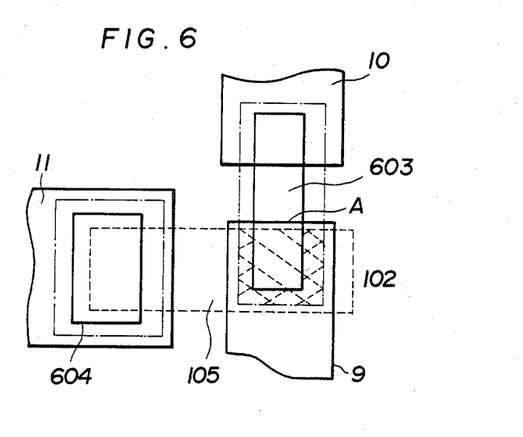
FIG. 6 is a plan view of the pattern of a transistor fabricated in accordance with the invention.
Figure 7:
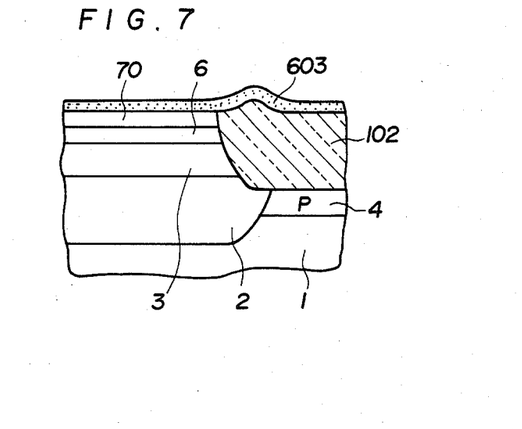
FIG. 7 is a cross-sectional view illustrating a region adjacent to a boundary of an oxide isolation layer of a transistor fabricated in accordance with the invention.

Referring now to FIG. 6, there is shown the plane pattern of a transistor fabricated in accordance with the invention; this drawing corresponds to FIG. 2 showing the plane pattern of a transistor fabricated in accordance with the prior art. As shown in FIG. 6, since the polysilicon layer 603 connecting to the emitter electrode wiring 10 functions as a diffusion source of the emitter region 7, the emitter region 7 is brought into contact with the isolation oxide layer 102 at the place designated by A in the drawing. Unlike the prior art method as shown in FIGS. 3A–3C, the emitter region 7 is formed by impurity diffusion from the polysilicon layer 603 in self-aligned fashion, and, therefore, the base region is not made narrower due to excessive etching in the vicinity of the isolation oxide layer 102. That is, as shown in FIG. 7, since the emitter region 70 and the active base region 6 is formed through the polysilicon layer 603 at the same time, such regions are parallel and the width of the base is constant. Accordingly, the base area is decreased and the base-to-collector capacitance is lowered because the base area is free from portions protruded between the emitter and the base electrodes and the base electrode contact region is formed in a minimal area by self-aligned process. In addition, as seen in FIG. 6, since the base electrode wiring 9 is formed on three sides of the emitter region 7, a double base structure is provided to decrease the base resistance sharply without increasing the base area.

Further, since the emitter junction is shallower than the surface of the external base region and is as deep as the base electrode contact layer, the current is free from absorption due to recombination at the boundary, and, therefore, the dependence of the current amplification factor upon the current in the low current regions is lowered.

Figure 8:
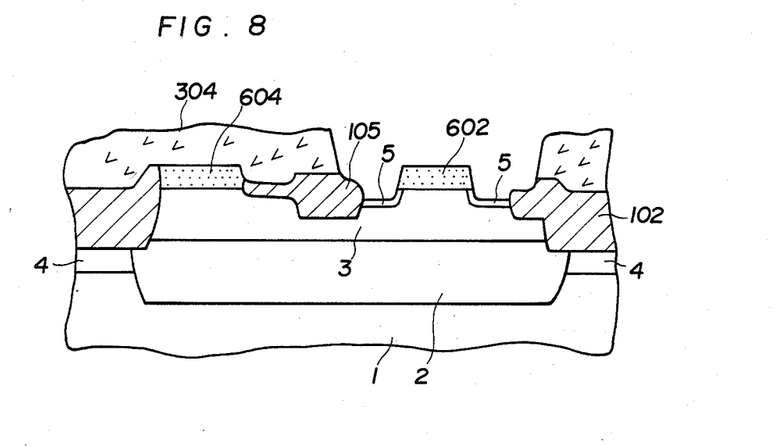
FIG. 8 is a cross-sectional view of a semiconductor device fabricated in accordance with another embodiment of the invention.

Referring now to FIG. 8, there is shown another embodiment of the invention, in which, instead of the diffusion of n-type impurity for forming the collector electrode contact region, in the step shown in FIG. 5G, a p-type impurity is selectively implanted and annealing is done after removing the oxide layer 106 in the base region using the photoresist layer 304 as a mask. Accordingly, the n-type impurity is diffused from the polysilicon layer 604 in which the n-type impurity has been implanted, and the electrode contact layer is thereby formed.

Needless to say, the present invention may be applied to manufacturing n-p-n transistors.

With the aforementioned aspects of the invention, there is only an isolation layer between the silicon layer on an emitter region and the metallic electrode layer on a base region, and, therefore, the distance between the base and the emitter is effectively made small. As a result, the frequency characteristics of a semiconductor device are improved.

In addition, since the emitter region is formed by diffusing an impurity for the purpose of forming the emitter region into the region which will act as the emitter, and, at the same time the base region is established by diffusing the impurity used in forming the base electrode into the semiconductor substrate, the boundary of the isolation region is prevented from being subjected to excessive etching and the emitter region and the base region come into contact with the isolation oxide layer region in parallel therewith.

Further, since the base electrode contact region is formed in a minimal area with self-registration with respect to the pattern used for forming the emitter region, the inactive base region is substantially reduced.

Further, since the dimension of the pattern of the polysilicon layer 603 forming the emitter layer is made less than one third of the dimension of the pattern of the photoresist layer 303 in FIG. 5A by side-etching and the so-called bird's beak shaped penetration upon selective oxidization, an emitter region of submicron geometry is easily realized.

Furthermore, since the emitter junction is formed such as to be shallower than the surface of the external base region and as deep as the base electrode contact layer, the current amplification factor is not so dependent on the current.

As described, semiconductor devices with improved frequency characteristics may be easily manufactured in accordance with the invention.

Having described preferred embodiments of the invention, it will be apparent to those skilled in the art that other embodiments within the scope of the invention may also be used. Accordingly, it will be understood that the invention is to be limited only by the scope of the appended claims.

What is claimed is:

1. A method for manufacturing a semiconductor device which is formed on a first conductivity type semiconductor substrate and has an emitter, a collector and base regions and is electrically insulated from adjacent semiconductor devices by an isolation region, comprising the steps of:
   (a) forming a multiple layer on a predetermined region of the surface of said semiconductor substrate, said multiple layer including a silicon layer, a nitride layer and an oxide layer which are deposited in their listed sequence;
   (b) side-etching the oxide layer only of said multiple layer such as to recess the oxide layer from the side walls of the nitride layer and the silicon layer;
   (c) forming a first oxide layer in a predetermined region on the semiconductor substrate by selective oxidation using the nitride layer as a mask;
   (d) selectively etching away the nitride layer and the silicon layer by using the side-etched oxide layer as a mask;
   (e) forming a second oxide layer between the silicon layer and the first oxide layer on the surface of said semiconductor substrate by selective oxidation using the selectively etched nitride layer as a mask;
   (f) removing the selectively etched nitride layer to leave the silicon layer exposed;
   (g) introducing a first conductivity type impurity into the silicon layer by using the second oxide layer as a mask;
   (h) removing a portion of the second oxide layer on a section of the base region which is to be an electrode contact portion;
   (i) introducing a second conductivity type impurity into a portion which is to be the base region;
   (j) diffusing the first conductivity impurity from the silicon layer to a portion which is to be the emitter region by heat-treating the semiconductor substrate to form the emitter region and, at the same time, completing the base region;
   (k) forming a third oxide layer on the side-wall and the upper surface of the silicon layer which are connected to the emitter region by conducting low temperature oxidization for the semiconductor substrate; and
   (l) forming in the emitter region a window penetrating the third oxide layer, said window being formed in a predetermined portion on the silicon layer, and providing electrode wiring for a base electrode and a collector electrode on predetermined portions of the semiconductor substrate.

2. The method as recited in claim 1 further including between the steps (k) and (l) the step of:
   forming a further nitride layer on the side-wall of the third oxide layer formed in the silicon layer which is connected to the emitter region.

3. The method as recited in claim 1 wherein said selective etching in the step (d) is anisotropic etching.

4. The method as recited in claim 1 wherein a portion at a predetermined depth of the semiconductor substrate is also etched away in the step (d).

5. The method as recited in claim 4 wherein the predetermined depth is substantially equal to the depth to which the first conductivity impurity diffuses into the substrate in step (j).

6. The method as recited in any one of the preceding claims wherein the silicon layer is either single-crystalline, poly-crystalline, or amorphous.

7. The method as recited in claim 4 wherein in step (j) the second conductivity impurity also diffuses into the substrate.

8. The method as recited in claim 7 wherein the depth to which the first conductivity impurity diffuses into the substrate in step (j) is less than the depth to which the second conductivity impurity diffuses into the substrate in step (j).

9. The method as recited in claim 7 wherein the oxidation temperature in step (k) is in the range 800° C.–900° C.

10. A method for manufacturing a semiconductor device which has a collector and an emitter/base region on a first conductivity-type semiconductor substrate, the method comprising the steps of:
  (a) depositing a silicon layer, a nitride layer and a first oxide layer in sequence to form isolated islands on the collector and the base/emitter regions of the surface of said semiconductor substrate;
  (b) selectively side-etching the first oxide layer to recess the oxide layer from the island side walls of the underlying nitride and silicon layers;
  (c) forming a second oxide layer on the semiconductor substrate to isolate the collector and base/emitter islands by selective oxidization using the nitride layer as a mask;
  (d) selectively etching away the nitride layer and the silicon layer to expose the substrate and form a collector contact area in the collector region and an emitter area in the base/emitter region by using the first oxide layer as a mask;
  (e) removing the first oxide layer;
  (f) forming a third oxide layer between the silicon layer in the collector area and the emitter area and the second oxide layer on the surface of the substrate by selective oxidation using the nitride layer as a mask;
  (g) removing the nitride layer to leave the silicon layer exposed;
  (h) implanting a first conductivity type impurity in the silicon layer in the collector contact and the emitter areas using the third oxide layer as a mask;
  (i) removing the third oxide layer to expose the substrate surface in the collector region and the base/emitter region;
  (j) implanting a second conductivity type impurity into the entire surface of the semiconductor device, including the collector contact area, the emitter area and the exposed substrate surface;
  (k) heat-treating the semiconductor substrate to cause the first conductivity impurity to diffuse from the silicon layer in the emitter area into the substrate to form an emitter and to cause the second conductivity type impurity to diffuse from the silicon layer into the substrate in the emitter area to form an active base area under the emitter area and to cause the second conductivity impurity to diffuse into the substrate around the emitter area to form an external base area; and
  (l) forming electrical connections to the silicon layer in the emitter area, to the collector contact area and to the substrate surface in the external base area.

11. The method as recited in claim 10 wherein step (l) further includes the steps of:
  (l1) electrically insulating the top surface and side-walls of the emitter area; and
  (l2) forming a first area of low-resistance material over the collector contact area;
  (l3) forming a second area of low-resistance material over a portion of the base/emitter area including a first portion of the emitter area; and
  (l4) forming a third area of low-resistance material over a second portion of the emitter area.

12. The method as recited in claim 11 wherein step (l1) further includes the steps of:
  (l11) forming a fourth oxide layer on the surface of the entire semiconductor device;
  (l12) depositing a second nitride layer on the fourth oxide layer;
  (l13) removing the second nitride layer from all surfaces except the side-walls of the emitter contact area; and
  (l14) removing the fourth oxide layer from the base area and from a portion of the emitter area.

13. The method as recited in claim 12 wherein in step (l12) the fourth oxide layer is formed by oxidizing the substrate at a temperature in the range 800° C.–900° C.

14. The method as recited in claim 12 wherein in step (l13) the second nitride area is removed by anisotropic etching.

15. The method as recited in claim 12 wherein in step (l14) the fourth oxide layer is removed by reactive ion beam etching.

16. The method as recited in claim 10 wherein said selective etching in the step (d) is anisotropic etching.

17. The method as recited in claim 10 wherein in step (d), a portion of the semiconductor substrate is also etched away to a predetermined depth.

18. The method as recited in claim 17 wherein the predetermined depth is substantially equal to the depth to which the first conductivity impurity diffuses into the substrate in step (k).

19. The method as recited in claim 10 wherein the depth to which the first conductivity impurity diffuses into the substrate in step (k) is less than the depth to which the second conductivity impurity diffuses into the substrate in step (k).

20. The method as recited in claim 10 wherein the semiconductor substrate has an n+ conductivity type in the collector region and an n− conductivity type in the base/emitter region.

* * * * *